(12) United States Patent
Koontz et al.

(10) Patent No.: US 6,181,004 B1
(45) Date of Patent: Jan. 30, 2001

(54) DIGITAL SIGNAL PROCESSING ASSEMBLY AND TEST METHOD

(76) Inventors: Jerry D. Koontz, 263 S. Pixley St., Orange, CA (US) 92868; Donald F. Coffin, 26381 Via Juanita, Mission Viejo, CA (US) 92691

( * ) Notice: Under 35 U.S.C. 154(b), the term of this patent shall be extended for 0 days.

(21) Appl. No.: 09/235,982

(22) Filed: Jan. 22, 1999

(51) Int. Cl.⁷ .................................................. H01L 23/52
(52) U.S. Cl. ............................. 257/691; 257/664; 438/18
(58) Field of Search ................................. 438/15, 18, 17; 257/691, 664, 48, 698; 361/777, 794, 780

(56) References Cited

U.S. PATENT DOCUMENTS

| | | |
|---|---|---|
| 3,828,228 | 8/1974 | Wong et al. . |
| 4,551,747 * | 11/1985 | Gilbert et al. . |
| 4,554,229 | 11/1985 | Small, Jr. . |
| 4,601,972 | 7/1986 | Small, Jr. . |
| 4,751,482 * | 6/1988 | Fukuta et al. . |
| 4,754,371 * | 6/1988 | Nitta et al. . |
| 4,927,983 | 5/1990 | Jones et al. . |
| 5,230,000 | 7/1993 | Mozingo et al. . |
| 5,281,864 | 1/1994 | Hahn et al. . |
| 5,287,247 | 2/1994 | Smits et al. . |
| 5,294,751 * | 3/1994 | Kamada . |
| 5,323,534 * | 6/1994 | Iwasaki et al. . |
| 5,331,514 * | 7/1994 | Kuroda . |
| 5,357,403 | 10/1994 | Haller et al. . |
| 5,377,198 | 12/1994 | Simpson et al. . |
| 5,418,689 | 5/1995 | Alpaugh et al. . |
| 5,432,677 | 7/1995 | Mowatt et al. . |
| 5,432,913 | 7/1995 | Smits et al. . |
| 5,451,721 | 9/1995 | Tsukada et al. . |
| 5,465,259 | 11/1995 | Hanafusa et al. . |
| 5,466,972 | 11/1995 | Frank et al. . |
| 5,568,492 | 10/1996 | Flint et al. . |
| 5,622,895 | 4/1997 | Frank et al. . |
| 5,625,225 * | 4/1997 | Huang et al. . |
| 5,665,650 | 9/1997 | Lauffer et al. . |
| 5,685,070 | 11/1997 | Alpaugh et al. . |
| 5,710,733 | 1/1998 | Chengson et al. . |
| 5,741,729 * | 4/1998 | Selma . |
| 5,781,560 | 7/1998 | Kawano et al. . |
| 5,786,630 | 7/1998 | Bhansali et al. . |
| 5,798,652 * | 8/1998 | Taraci . |
| 5,838,549 | 11/1998 | Nagata et al. . |
| 5,994,766 * | 11/1999 | Shenoy et al. . |
| 6,008,533 * | 12/1999 | Bruce et al. . |
| 6,022,750 * | 2/2000 | Akram et al. . |
| 6,054,334 * | 4/2000 | Ma . |

OTHER PUBLICATIONS

McDermott, PhotoLink®, "MicroVia: Interconnecting the Future", Rev. C, Mar. 1998.

* cited by examiner

*Primary Examiner*—Sheila V. Clark
(74) *Attorney, Agent, or Firm*—Knobbe, Martens, Olson & Bear, LLP

(57) ABSTRACT

A printed circuit module supports host processors and memories. The module permits easy upgrades and repairs of the semiconductor devices without requiring modification of the motherboard. The module includes a multilayer printed circuit board with a symmetrical design, permitting chips to be placed on both sides of the board. Microvias connect the contact points on a signal layer directly to a ground layer on the printed circuit board, thereby reducing the need for escape routing. This greatly simplifies the design layout of the module, The ground layer is located between two signal layers, thereby decreasing the crosstalk between the signal layers. The symmetrical design permits drilled vias to extend from a quadrant of one chip and exit through a similar quadrant on the opposite side of the circuit board. The modular design also simplifies impedance matching. Testing of the module may also be accomplished even when the module is not fully populated through the use of test bypass circuitry.

27 Claims, 19 Drawing Sheets

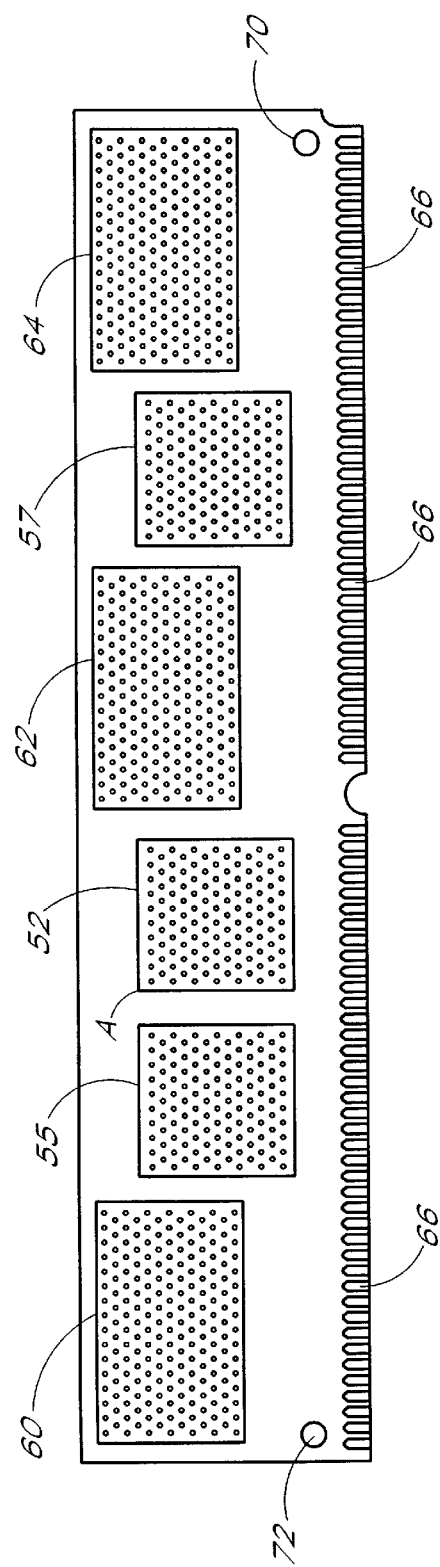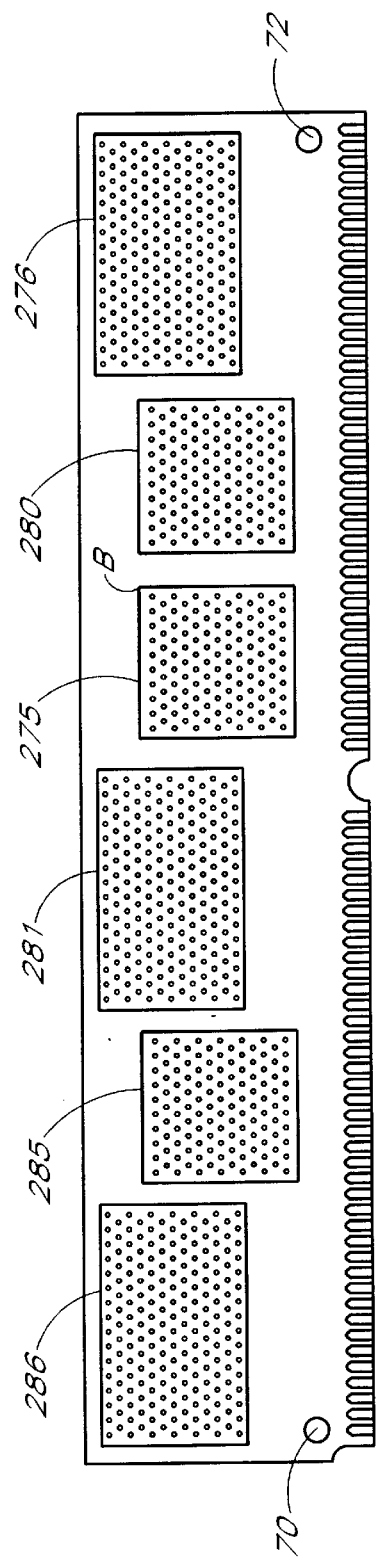

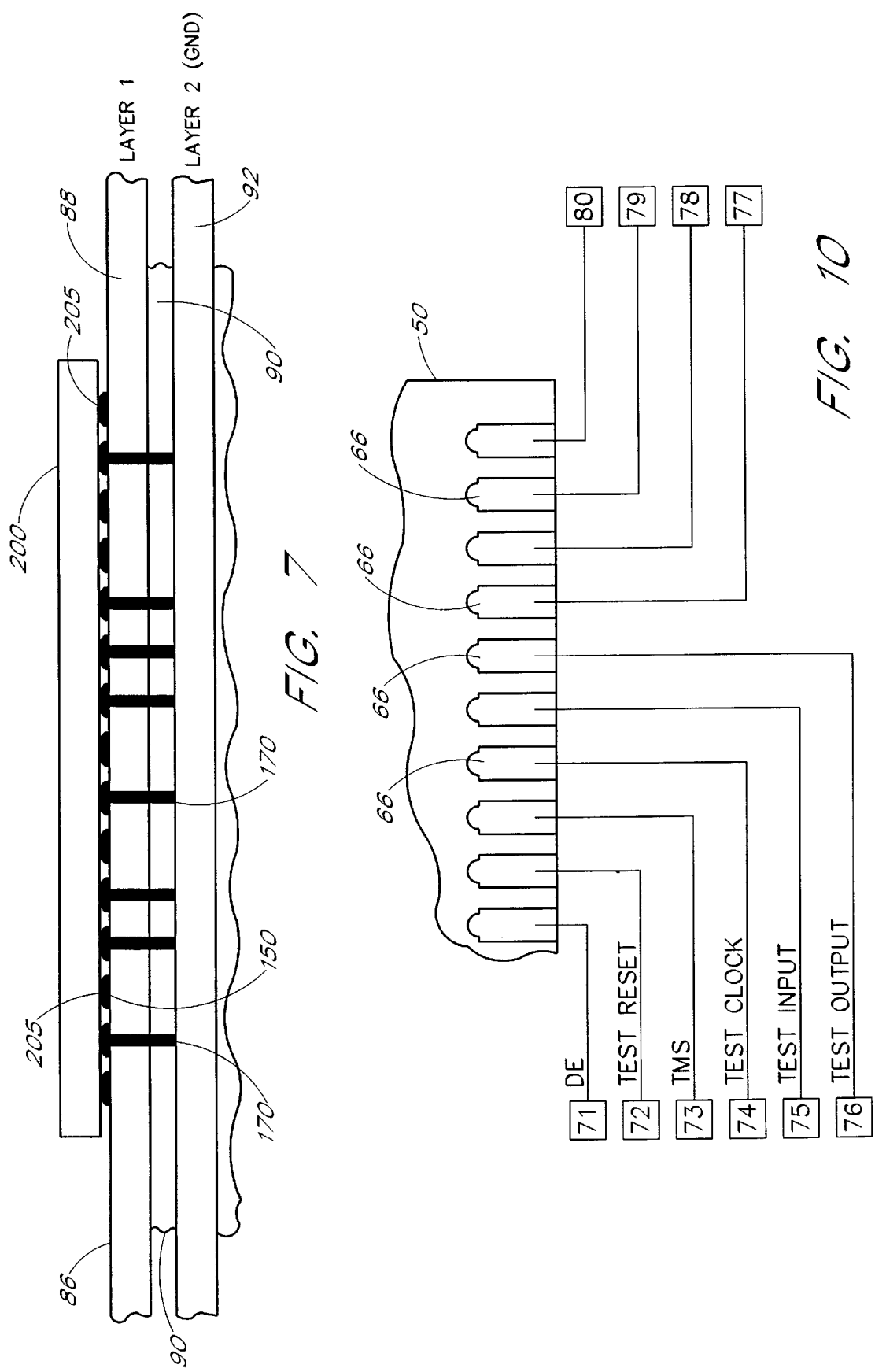

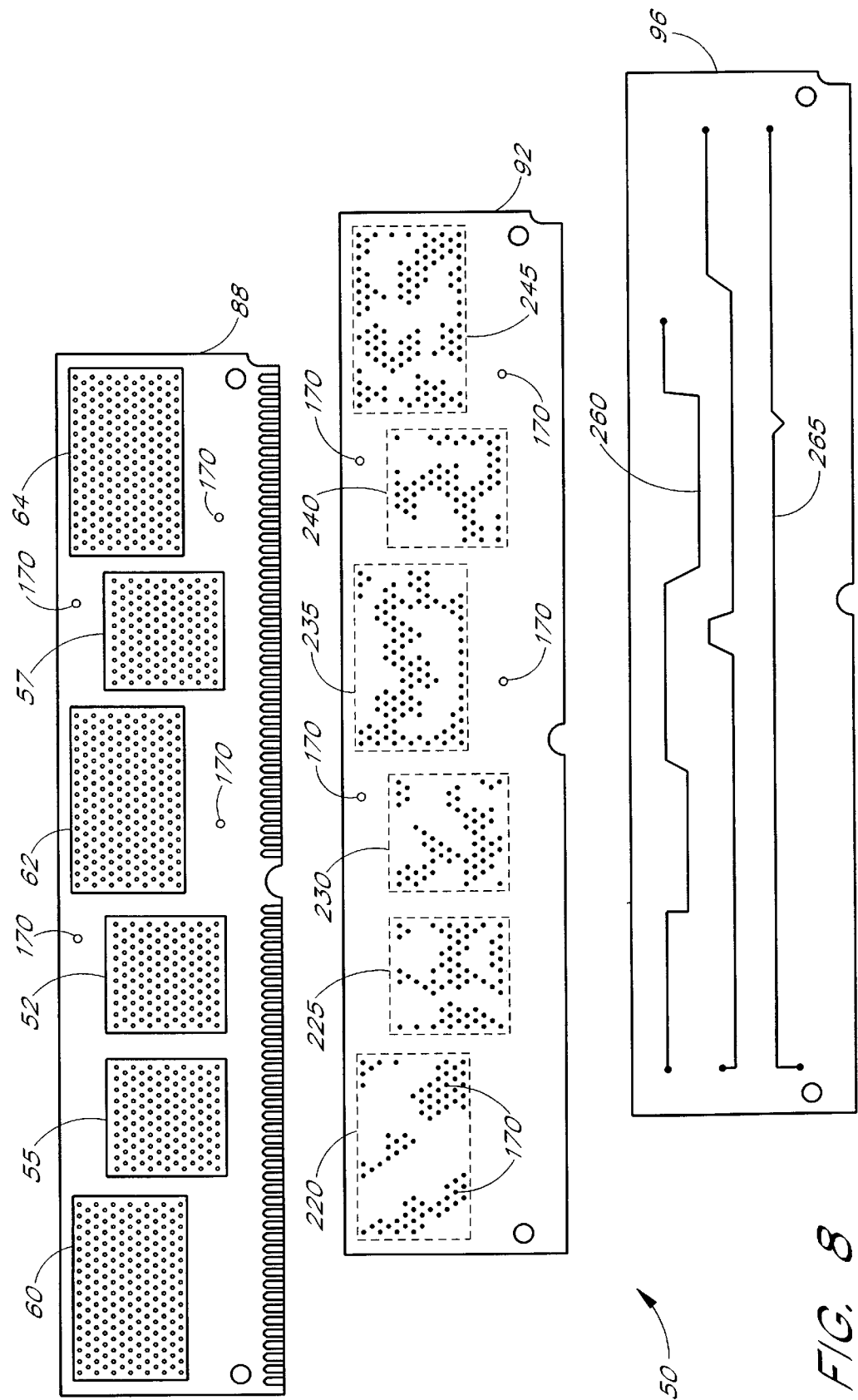

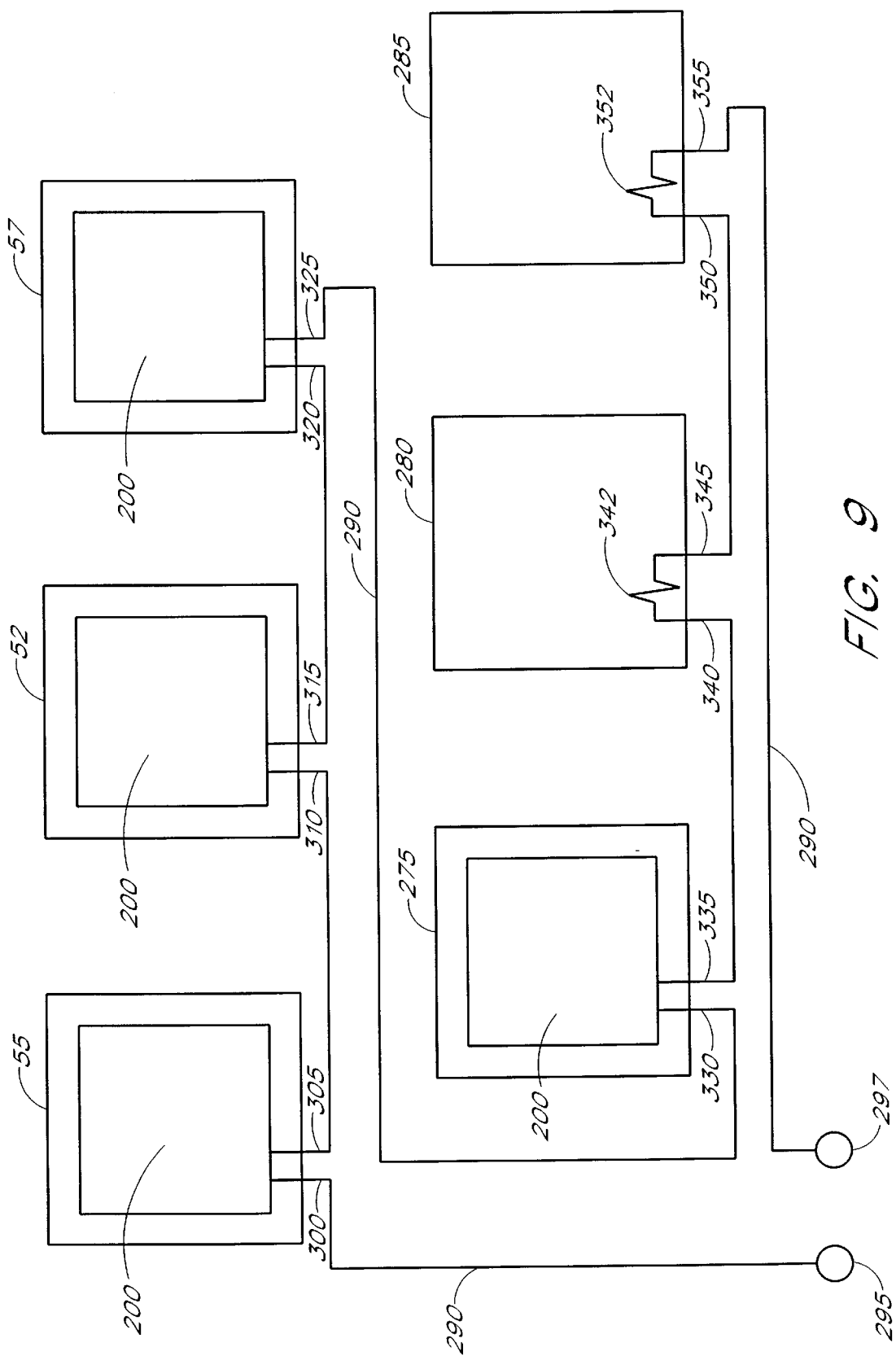

DIGITAL SIGNAL PROCESSING ASSEMBLY AND TEST METHOD

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to the field of fabrication of printed circuit boards. More specifically, the present invention relates to the fabrication of modular printed circuit boards.

2. Description of the Related Art

In the past, both processors and memory circuits were mounted directly on a motherboard. This required the motherboard designer to include pin layout and trace patterns for each of these integrated circuits in the motherboard design. As a result, any change requiring a different processor or memory circuit required changing the motherboard.

One technique used to solve the problem of continuously redesigning the motherboard whenever a different memory circuit was needed was to move the memory to a separate, removable circuit board. The removable circuit board, in turn, connected to the motherboard. Another approach was to make custom printed circuit boards that contained both processors and memory. However, customized circuit boards do not permit easy interchangeability or upgrades. Further, the cost of creating custom printed circuit boards can be substantial.

There is also an ongoing need to decrease the size of printed circuit boards while at the same time increasing the number of processors and memory circuits hosted on the board.

SUMMARY OF THE INVENTION

The invention enhances the modularity of replaceable printed circuit boards which support processors and memories. The motherboard does not have to provide interconnections between the processors and the memories, and, as a result, can be less complicated and less expensive to manufacture.

Because the processors and associated memory circuits are provided to a system in a modular board, the layout and design for the specific integrated circuit used can be accomplished by a third party manufacturer of the modular board. The host motherboard only needs to be designed to interconnect with the pinouts of the modular board.

The modular design of the processors permits simpler upgrades and easy repairs. In contrast, if the processors are mounted directly on the motherboard, any upgrades or repairs would require replacing the entire motherboard, even if every other component on the motherboard remained the same. The present invention permits upgrades and repairs by simply replacing the printed circuit board module.

Modularity also provides increased performance. The impedance of signals travelling between processors and memories in a module may be matched to provide better performance. In contrast, it is more difficult to obtain impedance matching of signals on a motherboard due to the size and the number of components involved.

One embodiment of the invention decreases the amount of escape routing needed on a printed circuit through the use of microvias. A processor typically connects to the printed circuit board through a footprint, such as a ball grid array. With the use of microvias, individual surface mount pads may be directly connected to a lower layer of the printed circuit board without the use of escape routing. By decreasing the escape routing for each integrated circuit, the layout of the trace routing for the printed circuit board is simplified and the size of the printed circuit board may be decreased.

Another embodiment of the invention uses symmetry to improve the design of the processor module. Processor footprints and memory footprints are included on both the front and back side of the printed circuit board. The layouts of the front and back sides are similar such that the footprints of at least one integrated circuit on the front side is aligned with the footprint of a corresponding integrated circuit on the back side. The symmetrical design increases the number of integrated circuits that can be hosted on the printed circuit board and also permits the use of more drilled vias extending through the printed circuit board. Because the layouts are similar, a via drilled through a pad quadrant (the area between four surface mount pads) on the front side of the printed circuit board will exit the back side of the printed circuit board through a similar pad quadrant. This feature permits processors and memory integrated circuits to be mounted on both sides of the printed circuit board without a via drilled through one quadrant interfering with a surface mount pad on the opposite side.

Another embodiment of the invention also reduces crosstalk between signal layers through isolation. Printed circuit boards typically contain a ground layer. In one aspect of the invention, the ground layer is located between the top signal layer and a second signal layer. Because the two signal layers are separated by the ground layer, crosstalk is reduced. Because the printed circuit board is symmetrical, the bottom layers include a bottom signal layer and another signal layer separated by a second ground layer.

Another embodiment of the invention permits testing of the processors regardless of how many processors are mounted on the module. By linking the JTAG inputs and outputs of each processor footprint, a series testing circuit is created. If a processor is not mounted with a processor footprint, a testing bypass device is added to permit the test signal to pass.

Another embodiment of the invention is a method of testing integrated circuits mounted on a printed circuit board including linking a plurality of footprints to create a test path. The test path has an input and an output, and each of the footprints has a test input and a test output. The method further comprises the steps of inserting a test bypass element between the test input and the test output of any footprint not populated by an integrated circuit and then applying a test vector to the test input pin of the test path.

Another embodiment of the invention is a multilayer printed circuit board comprising a first signal layer having a first plurality of signal lines and a second signal layer having a second plurality of signal lines. A signal may travel from one of the first plurality of signal lines to one of the second plurality of signal lines without encountering a substantial change in impedance. A ground layer is located between the signal layers to reduce crosstalk between the signal layers.

Another embodiment of the invention is a printed circuit board having at least twelve footprints capable of mounting integrated circuits. The printed circuit board comprises a plurality of conductive layers and a plurality of insulation layers. The conductive layers are separated by the insulation layers. The layers have a dimension of approximately 11.43 centimeters in length and approximately 2.5 centimeters in height. Surface mount pads are located within the footprints and are adapted to mount half of the integrated circuits on a first conductive layer, or top signal layer of the printed circuit board. Other surface mount pads are located within the footprints and are adapted to mount half of the integrated circuits on a second conductive layer, or bottom signal layer of the printed circuit board. A plurality of microvias within each surface mount pad directly electrically connects either the top signal layer to a first ground layer or the bottom signal layer to a second ground layer.

BRIEF DESCRIPTION OF THE DRAWINGS

These and other features and advantages of the invention will become more apparent upon reading the following detailed description and upon reference to the accompanying drawings.

FIG. 3A is a plan view of the top surface of a module according to the present invention.

FIG. 3B is a plan view of the bottom surface of a module according to the present invention.

FIG. 7 is a cut-away side view of semiconductor integrated circuit mounted on a module according to the present invention.

FIG. 8 is an exploded view of the top three layers of a module according to the present invention.

FIG. 9 is a schematic view of the test circuit path connecting the processor footprints on a module according to the present invention.

FIG. 10 is a schematic view showing the test circuit pin connections according to the present invention.

DETAILED DESCRIPTION

Figure 1:
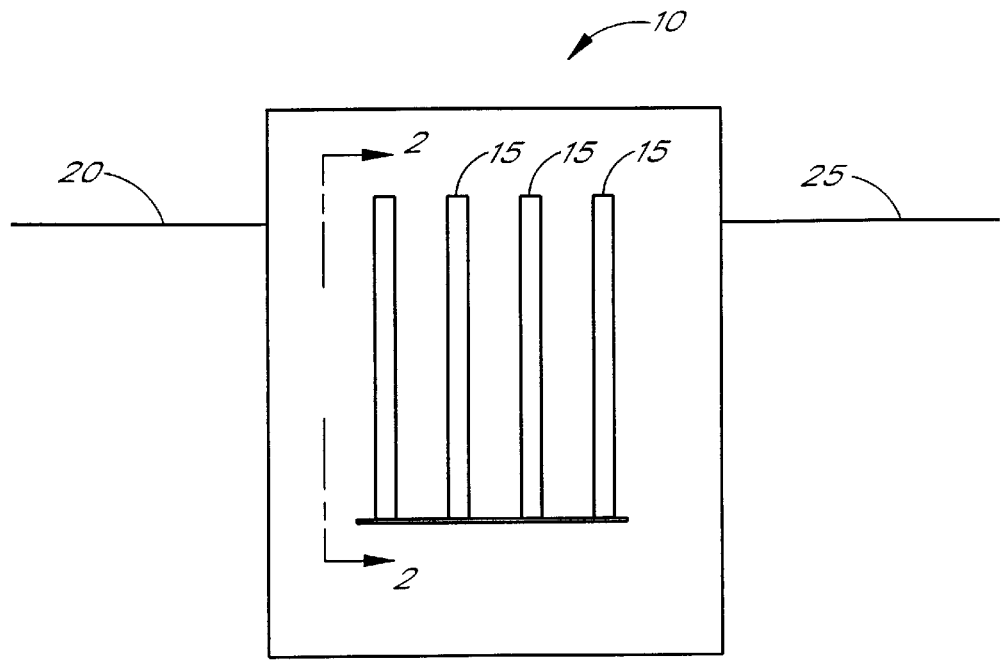
FIG. 1 illustrates a routing device including printed circuit boards having replaceable modules according to the present invention.

FIG. 1 illustrates a network router 10 or a similar device using modules according to the present invention. In FIG. 1, a signal line 20 (representing a plurality of signal lines) provides signals to the network router 10. The signals are processed through a plurality of add-in boards 15 mounted within the router. The number of add-in boards 15 used within a router 10 may vary depending upon the amount of processing power or memory required. The add-in boards 15 may include processors, memory circuits, or other devices necessary to execute the functions of the router 10. For example, the processors may be digital signal processors (DSPs), and the memory circuits may be static random access memory (SRAM). The processors are programmed to process the input signals and generate one or more output signals. After the input signals are processed in the router 10, output signals are output on a signal line 25, which represents a plurality of signal lines.

To accommodate the more powerful hardware and software available, the router 10 includes custom boards having multiple processors. Previously, the size of the custom circuit boards increased not only due to the physical size of the processor and memory circuits, but also due to the number of trace routing lines required to interconnect the pinouts of the integrated circuits. Each pin of the integrated circuit requires a trace routing line to link the pin to the appropriate component or layer of the printed circuit board. The use of trace routing extending from a pin in the connection grid is known as escape routing. As more routing lines were needed and more escape routing lines were used, the size of the printed circuit board increased. With the ever shrinking size of electronics, the circuit boards with multiple processors tended to be too large and cumbersome to include in many applications.

Figure 2:
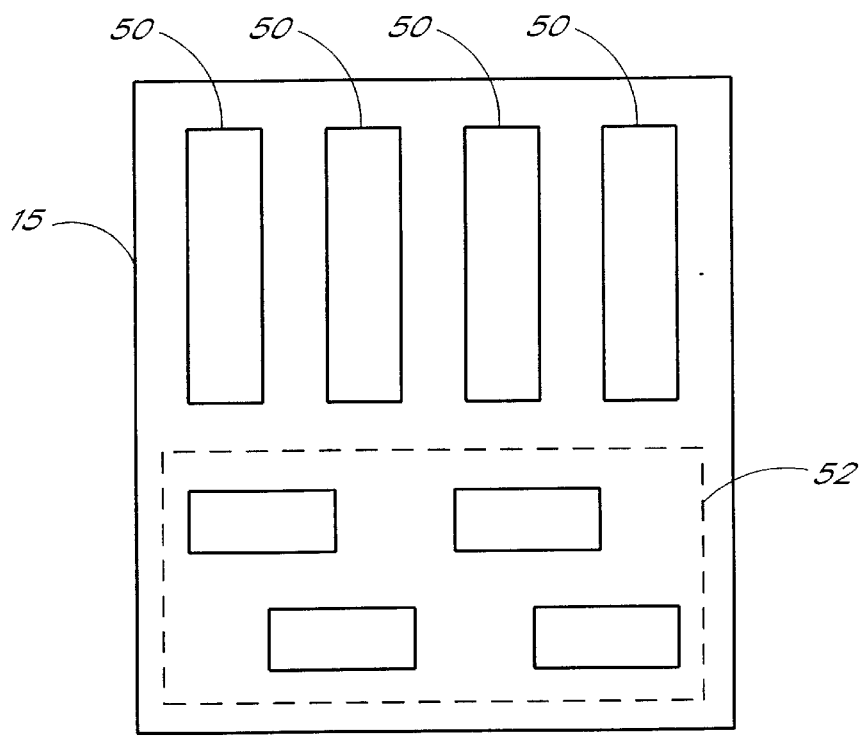
FIG. 2 is a plan view of a printed circuit board including modules according to the present invention.

FIG. 2 shows a plan view of one of the add-in boards 15 from the router 10 of FIG. 1. In FIG. 2, a series of modules 50 are inserted into the add-in board 15. The modules 50 are connected to the add-in board 15 so as to be removable, as is well known in the art. The number of modules 50 connected to any particular add-in board 15 may vary as the functionality requires. Therefore, although an add-in board 15 may have the capability of hosting a certain number of modules 50, the specific requirement of any particular application may only need to use fewer modules 50. Because the modules 50 are separate components, the add-in board 15 may contain only the number of modules 50 necessary to perform the required function, thereby creating cost savings. If a particular application requires more modules 50, additional modules 50 may be inserted into the add-in boards 15. The modules 50 may be constructed of a printed circuit board, a flexible printed circuit board, or any other suitable material.

If an add-in board 15 is fully populated with modules 50 and further processing power is necessary, an additional add-in board 15 may be used to host additional modules 50. The number of add-in boards 15 and modules 50 ultimately used is dependant on the size of the router 10 and the functionality desired. Further, additional circuitry 52 may be included on the add-in board 15 to interface the modules 50 with the router 10 and also to provide additional processing power. This additional circuitry 52 may be directly mounted to the add-in board 15. The module 50 may be attached to any host board, and is not limited to use with an add-in board 15 as shown.

When a change in the type, number, or design of a processor or memory circuit is necessary, the original module 50 may be removed and a new module 50 including the necessary changes inserted. Designers of the modules 50 only need to ensure the pinouts of the modules 50 are compatible, and the add-in boards 15 or motherboard need not change.

FIG. 3A illustrates a top layer of a module 50 according to one embodiment of the invention. The module 50 includes a series of processor footprints 52, 55 and 57. The processor footprints 52, 55 and 57 include connections (i.e., pads) to permit a processor to be mounted to the module 50. One type of connection that may be used to connect the processor to the module 50 is a ball grid array. Other types of connections include thin-small outline packages (TSOP), dual in-line packages (DIP), small outline J-leads (SOJ), and pin grid arrays (PGA).

The module 50 may be designed to accept processors including digital signal processors, microprocessors, floating point units, CPUs, or any other processor. The module 50 also includes memory footprints 60, 62 and 64. The memory footprints 60, 62 and 64 are designed to accept memory elements onto the module 50. Such memory elements may include SRAM, DRAM, PROM, ROM, EEPROM, EDO, RAMBUS, FRAM, and any other memory elements. Although the module 50 is shown with three processor footprints and three memory footprints, it will be appreciated that the module 50 can be modified to include any number of processor and/or memory footprints. Further, the module 50 may include other semiconductor devices other than processor and memory elements.

FIG. 3B illustrates a bottom layer of a module 50 according to one embodiment of the invention. The bottom layer of the module 50 is an approximate mirror image of the top layer of the module 50. Therefore, the bottom layer of the module includes a series of processor footprints 275, 280, and 285 which correspond to the processor footprints 52, 55 and 57, respectively. The bottom layer of the module 50 also includes memory footprints 276, 281, and 286 which correspond to the memory footprints 60, 62 and 64, respectively. For example, the processor footprint 52 on the top layer and the corresponding processor footprint 275 on the bottom layer are positioned so that a point A on processor footprint 52 is located directly above a point B on processor footprint 275.

The module 50 also includes a plurality of connector pinouts 66 to provide an interface between semiconductor devices mounted on the module 50 to an add-in board 15. Each processor installed on the module 50 communicates with the add-in board 15 via the connector pinouts 66. The inputs and outputs of each processor share common connections to connector pinouts 66 so that only a single processor interfaces with the connector pinouts 66 at any given time. The use of pinouts to connect a module to a printed circuit board is well known and will not be described in detail. In the illustrated embodiment, there are 80 pinouts on the module. It can be appreciated that a module can be designed with any number of pinouts to meet a specific requirement, including a 72 pinout connector, a 90-pin connector, a 144 pinout connector, and a 168 pinout connector. Other connection methods, such as the PCI Mezzanine Connector (PMC), may also be used.

According to one embodiment of the invention, the module 50 measures approximately 11.43 centimeters in length and approximately 2.5 centimeters in height. In this embodiment, the module is capable of hosting six semiconductor devices on each side of the module.

The module 50 shown in FIGS. 3A and 3B also contains two attachment apertures 70 and 72. When the module 50 is inserted into an add-in board 15 or other host board, the host board may include hooks or other attachment devices to insert into the attachment apertures 70 and 72 to assist in aligning and holding the module 50. The attachment apertures 70 ad 72 help maintain a positive contact with the host board.

Figure 4:
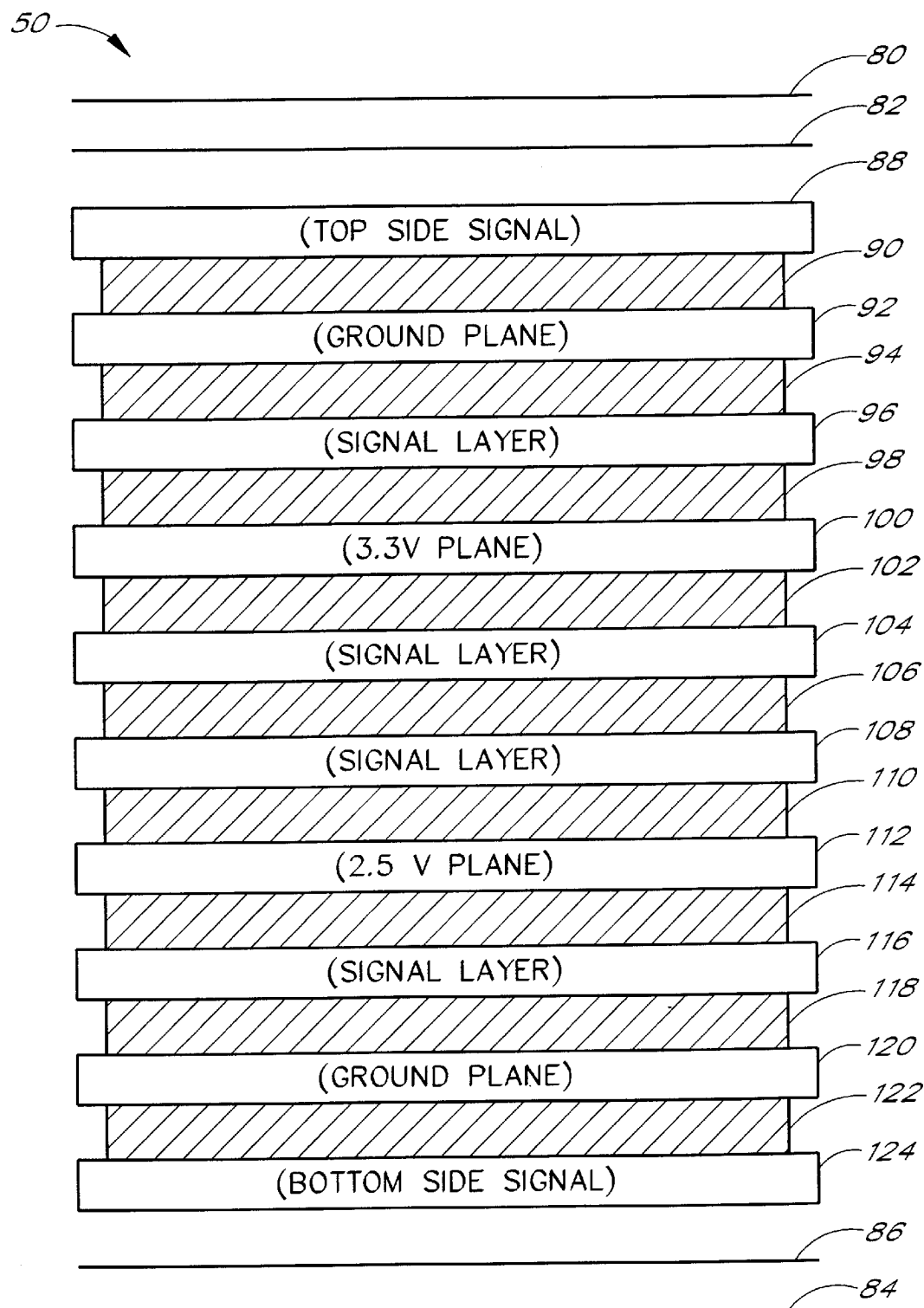
FIG. 4 is an edge view illustrating the layers in a module according to the present invention.

FIG. 4 illustrates an edge view of the module 50 showing the layer structure of the module 50. As can be appreciated from FIG. 4, the layering of the module 50 is symmetrical with the top five conductive layers being identical to the bottom five conductive layers other than the power planes having different voltages in the illustrated embodiment. Details of each layer will be discussed below.

The top and bottom surfaces of the module 50 are silk screen layers 80 and 84. The silk screen layers 80, 84 are silk screened immediately on top of soldermask layers 82 and 86. Immediately below the soldermask layer 82 is the top side signal layer 88. The top side signal layer 88 includes the processor footprints 52, 55, and 57 and the memory footprints 60, 62, and 64 as shown in FIG. 3A. The top side signal layer 88 also contains signal line connections between the processor footprints 52, 55, and 57 and the memory footprints 60, 62, and 64. The top side signal layer 88 further includes the connector pinouts 66 permitting connection of the module 50 to the add-in board 15.

The remaining layer structure of the module 50 beneath the top side signal layer 88 includes a first insulating layer 90, a ground plane 92, a second insulating layer 94, a first signal layer 96, a third insulating layer 98, a first power layer 100, a fourth insulating layer 102, a second signal layer 104, a fifth insulating layer 106, a third signal layer 108, a sixth insulating layer 110, a second power plane 112, a seventh insulating layer 114, a fourth signal layer 116, an eighth insulating layer 118, a second ground plane 120, a ninth insulating layer 122, and a bottom side signal layer 124. The bottom side signal layer 124 includes the processor footprints 275, 280, and 285 and the memory footprints 276, 281, and 286 as shown in FIG. 3B. The bottom side signal layer 124 also contains signal line connections between the processor footprints 275, 280, and 285 and the memory footprints 276, 281, and 286. The bottom side signal layer 124 further includes the connector pinouts 66 permitting connection of the module 50 to the add-in board 15.

Each insulating layer 90, 94, 98, 102, 106, 110, 114, 118 and 122 electrically isolates the conductive layers from each other. The thicknesses of the insulation layers depend on a variety of factors, including the ease of manufacture, the mechanical strength required, the mechanical rigidity required, the electrical insulation required, the dielectric constant of the insulation, and the material used. The thickness of the insulation layers may generally be in the range of 3 micrometers to 1.5 millimeters. The insulating layers may be made of epoxy containing glass woven fabric or a resin material such as polyamide which has a high insulating performance and which can be readily laminated. The insulating layers may also be customized as necessary for use with specialized via construction techniques, including photo microvia processing (see, for example, U.S. Pat. No. 5,451,721). Custom dielectrics for various processes are well known in the art.

The signal layers 88, 96, 104, 108, 116 and 124, the ground plane layers 92 and 120, and the power plane layers 100 and 112 are metal-conductive layers. The metal-conductive layers are ordinarily made of copper foil but may be made of other electrically conductive materials, preferably with low resistivity. The metal conductive layers are preferably 3 to 100 micrometers thick. Because the resistance increases as the thickness decreases, and because the pattern formation becomes more difficult to achieve as the thickness increases, it is particularly preferable to set the thickness in the range of 10 to 40 micrometers.

The ground plane layers 92 and 120 are the first conductive layers beneath the top and bottom side signal layers 88 and 124, respectively. By including the ground plane layers 92 and 120 near the top and bottom side signal layers 88 and 124, microvias may be used to connect the respective processor footprints and memory footprints from the top and bottom side signal layers 88 and 124 to the respective ground plane layers 92 and 120 without the use of trace routing. Microvias are apertures through the signal and dielectric layers with a diameter of generally about 70–150 micrometers. Microvias can be formed in a variety of processes, including a photo process or a laser process.

The construction of multilayer modules 50 presents many design problems. For example, when signals travel between layers of the modules, signal reflections and other problems may occur if the signal lines on the layers do not have matched impedances. It is desirable for the signal lines to have a common impedance to reduce the effect of impedance mismatching.

The impedance of the signal lines on a conductive layer may be controlled by the thickness and type of dielectric material used in the insulation layer and by the thickness and width of the metallization of the conductive layer using known techniques. By positioning signal layers on opposite sides of the ground layers, and by selecting the type and thickness of the dielectric between the ground layer and the two signal layers, the impedance of the signal layers may be controlled and matched.

In one embodiment of the invention, the signal lines on the top side signal layer 88 and the signal lines on the first signal layer 96 have approximately the same impedance. This permits the signal to travel from the top side signal layer 88 to the first signal layer 96 and back to the top side signal layer 88 without encountering a change in impedance, thereby eliminating any impedance mismatch. This provides the advantage of providing a cleaner (i.e., less noisy) signal and a more predictable result.

By including the ground plane layer 92 between the top side signal layer 88 and the first signal layer 96, the ground plane layer 92 also acts as a shield between the top side signal layer 88 and the signal layer 96. Therefore, signals propagating on the top side signal layer 88 do not experience crosstalk with signals propagating on the first signal layer 96. The second ground plane layer 120 provides a similar function with respect to the bottom side signal layer 124 and the fourth signal layer 116.

The first power plane 100 provides power at a first voltage to the module 50. The second power plane 112 provides power at a second voltage to the module 50. Through the use of the two power planes 100 and 112, both a relatively high voltage and a relatively low voltage power plane are provided to the module 50. Two power planes are needed, for example, to operate integrated circuits, such as processors, which require a first voltage to operate input/output interfaces and a second voltage to operate internal logic. Both power planes 100 and 112 are accessible from both the top side signal layer 88 and the bottom side signal layer 124 so that the processors and memories on both layers can be electrically connected to both power planes. The two power planes also help isolate the signals on the signal layers 96, 116 from the signals on the signal layers 104, 108.

The second signal layer 104 and the third signal layer 108 may be included if additional signal layers are necessary. The second and third signal layers 104 and 108 permit trace routing away from the high speed signal layers 96 and 116. The second and third signal layers 104 and 108 may be used for low speed signals, where the effect of crosstalk is generally not a problem. In some embodiments, the second and third signal layers 104 and 108 are not required and these signal layers may be removed.

The lower three conductive layers 116, 120 and 124 are identical to the top three conductive layers 88, 92 and 96. Therefore, the second ground plane 120 separates the fourth signal layer 116 from the bottom side signal layer 124, providing for both reduced crosstalk between the signals layers 116 and 124 and direct access to the ground plane 122 from processors and semiconductor devices mounted on the bottom side signal layer 124 through the use of microvias 170.

In one embodiment of the invention, the top side signal layer 88, the first signal layer 96, the fourth signal layer 116 and the bottom side signal layer 124 all have an impedance of approximately 51 ohms. The second and third signal layers 104 and 108 have an impedance of approximately 47 ohms. The top side signal layer 88 and bottom side signal layer 124 are approximately 1.4 mils (0.0355 millimeters) thick. Each of the other conductive layer is approximately 0.7 mils (0.0178 millimeters) thick. The insulating layers 90 and 122 directly beneath the top side signal layer 88 and the bottom side signal layer 124 are approximately 2 mils (0.0507 millimeters) thick. The second and eighth insulating layers are approximately 6.5 mils (0.165 millimeters) thick. The third and seventh insulating layers are approximately 5.48 mils (0.1396 millimeters) thick. The fourth and sixth insulating layers are approximately 3.5 mils (0.0888 millimeters) thick. The fifth insulating layer is approximately 5.48 mils (0.1396 millimeters) thick.

Figure 5A:
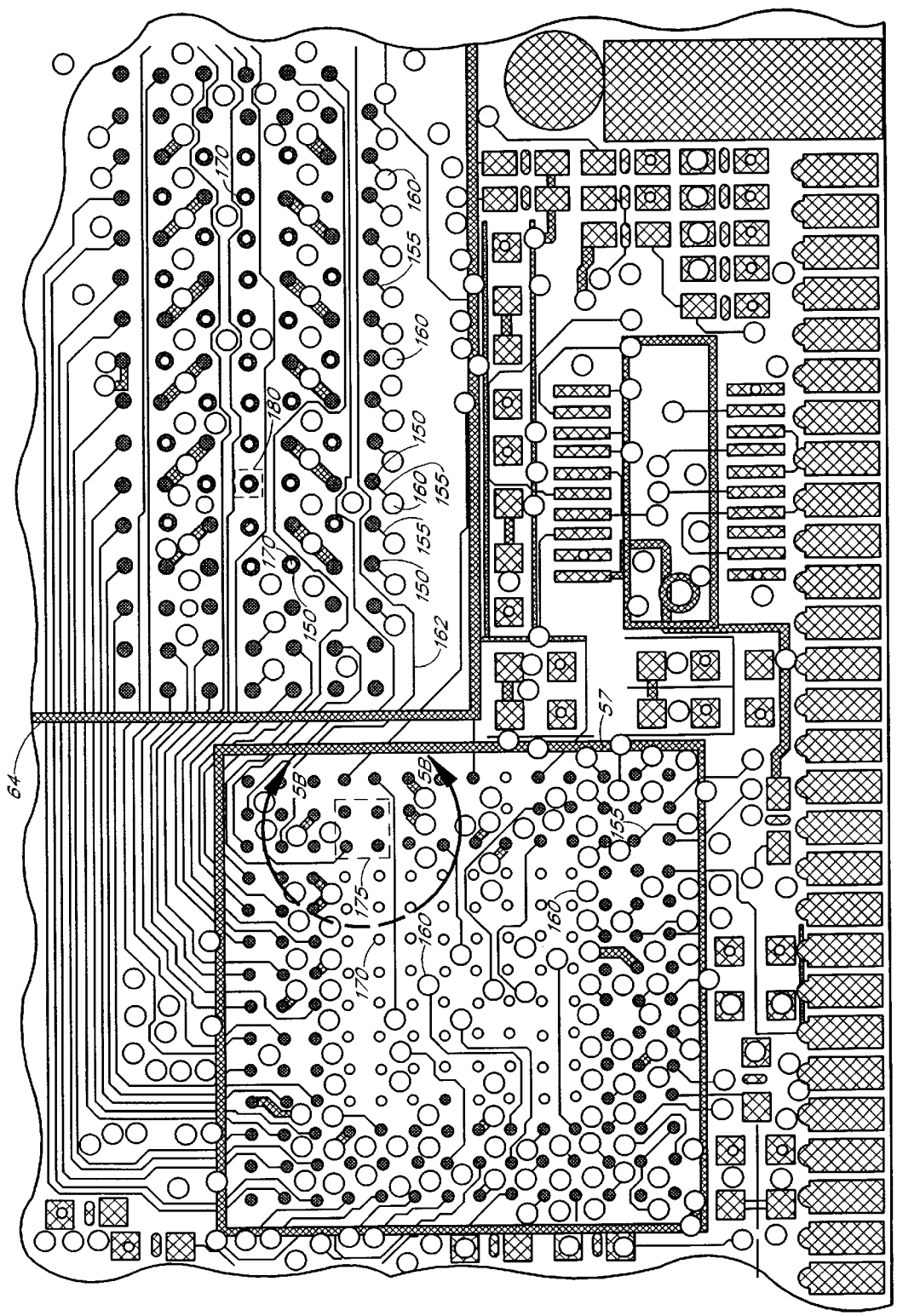
FIG. 5A is a magnified, partial plan view of the layout and design of a module according to the present invention.

Connections on the top side signal layer 88 to both the processor and the memory circuits on the module 50 according to one embodiment of the invention are shown in FIG. 5A. In particular, FIG. 5A shows a detailed view of the processor footprint 57 and the memory footprint 64. The processor footprint 57 and the memory footprint 64 include surface mount pads 150, escape routing 155, drilled vias 160, and microvias 170. A plurality of surface mount pads 150 correspond to the number of pins on the processor circuit or memory circuit to be mounted onto the module 50. The processor and memory circuits are attached to the module 50 using known techniques including the use of ball grid arrays.

When connecting the appropriate integrated circuit to the module 50, each pin of the integrated circuit is electrically connected to the appropriate location on the module 50. To provide an electric signal from one of the surface mount pad 150 to another location on the module 50, a trace known as escape routing 155 is used. The escape routing 155 connects the surface mount pad 150 to a drilled via 160 or to other surface mount pads. Other components installed on the module 50 are also connected with the use of trace routing 162. The trace routing 162 may extend from the drilled vias 160, from the surface mount pads 150, or from any other component on any signal layer.

The use of the escape routing 155 and the trace routing 162 to connect a surface mount pad to another location on the module 50 requires space on the module 50. As more escape routing 155 is used, and as the complexity of the layout of the module 50 increases, it is increasingly difficult to interconnect all the pins by using only one or two signal layers.

The drilled vias 160 electrically interconnect multiple layers of the module 50. This permits, for example, a component on the top signal layer 88 to be connected to the power plane 100. The drilled vias 160 may also be used to connect the top side signal layer 88 to the first signal layer 96. The size of drilled vias generally range from about 7 mils (0.178 millimeters) to about 20 mils (0.507 millimeters).

One aspect of the present invention is to use microvias to reduce the number of escape routings and trace routings needed on a printed circuit board. In particular, microvias 170 are formed within selected surface mount pads to interconnect either the top or bottom side signal layers 88 and 124 to the respective ground planes 92 and 120. Microvias are generally of the size of 70–150 micrometers, and are generally smaller than the size of the surface mount pad 150. This permits a microvia 170 to be formed within the surface mount pad 150. The microvias 170 permit connections between layers of the module 50 without the use of escape routing 155 or other trace routing 162.

In one embodiment of the invention, the microvias 170 provide connections to the ground plane layers 92 and 120. Because a significant percentage of all connections to a processor or a memory circuit on the module 50 are ground connections, the use of the microvias 170 greatly reduces the amount of escape routing 155 or trace routing 162 required to connect the ground connections of the processors and memory circuits of the module 50. For example, in one specific application, out of approximately 1,400 circuit connections, approximately 700 of the circuit connections were connected to ground. The use of microvias 170 to make those ground connections directly eliminates approximately 50% of the escape routing 155 and the trace routing 162 which would otherwise be necessary on the module 50.

Figure 5B:
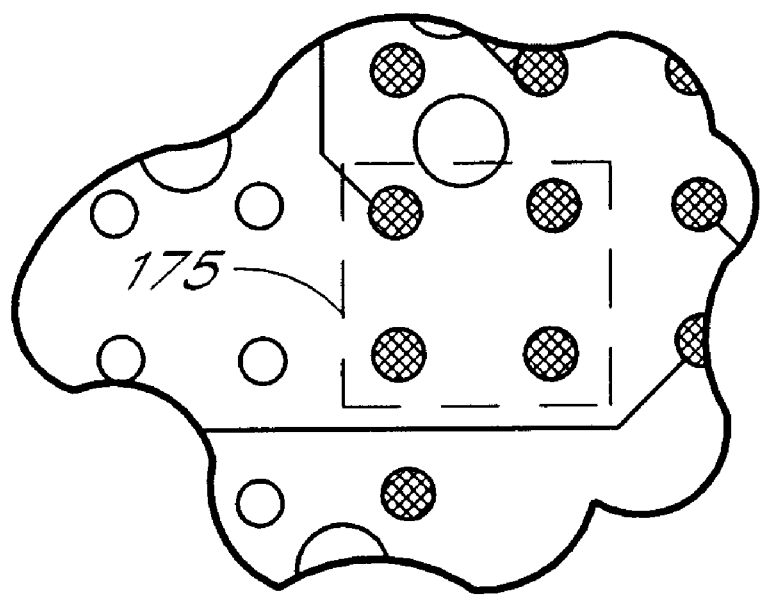
FIG. 5B is a plan view of a pad quadrant according to the present invention.

The surface mount pads 150 are generally arranged in a rectangular grid formation. Because of the rectangular grid, a group of four surface mount pads 150, as seen in FIG. 5B, forms an area known as a quadrant 175. The area within the quadrant 175 does not contain any surface mount pads 150 and therefore may be used for insertion of drilled vias 160, escape routing 155, and trace lines 162 without interference with the surface mount pads 150. As will be seen below, because of the symmetrical layout of the module 50, a drilled via 160 can be formed in the quadrant 175 and pass completely through the module 50 to exit through another quadrant on the opposite side of the module 50. The specific connections of each layer of the module 50 in accordance with one embodiment of the invention are included as Appendix A.

Figure 6:
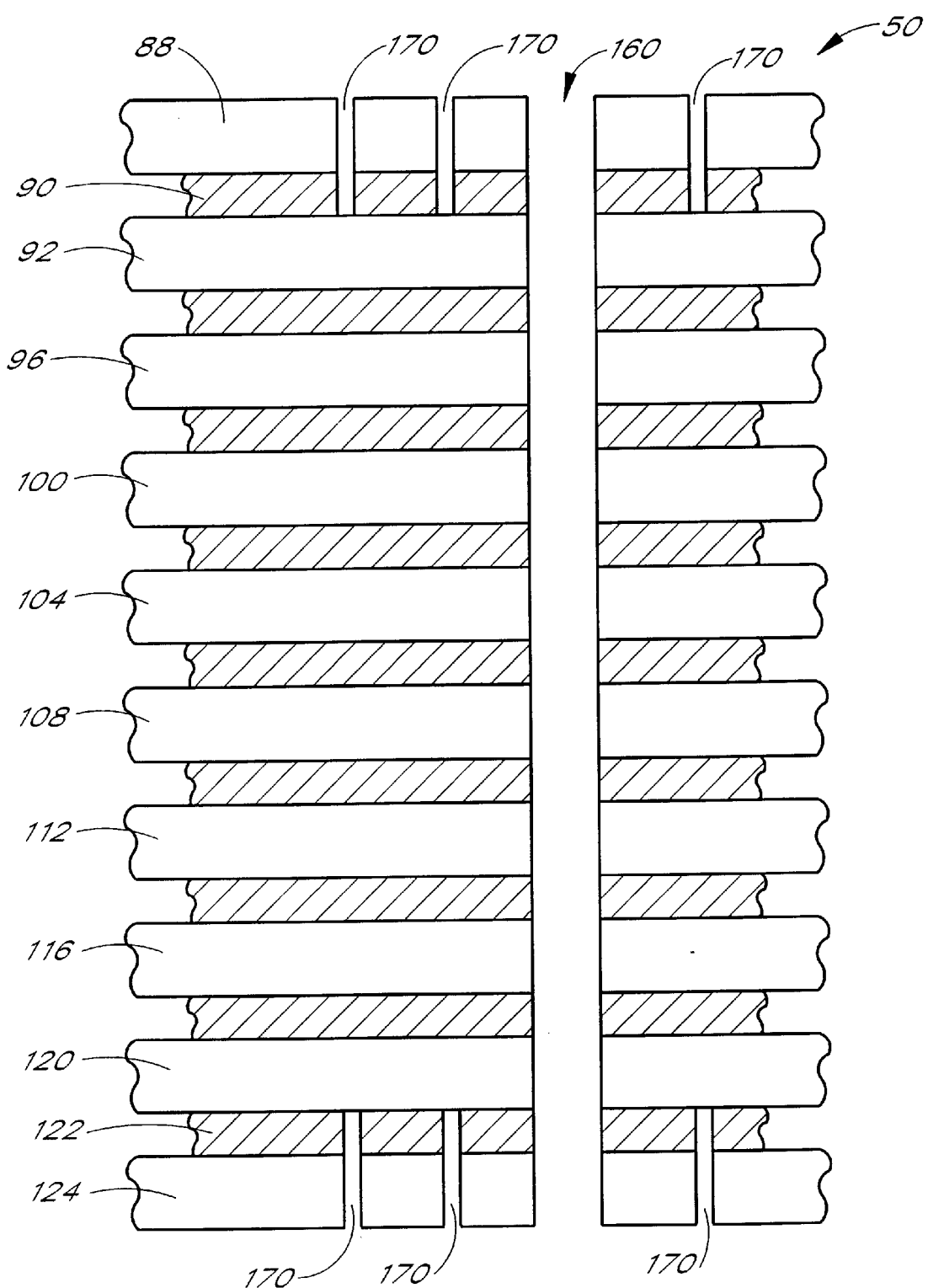
FIG. 6 is an edge view of the layers of a module including both vias and microvias according to the present invention.

The top side signal layer 88 of the module 50 includes a series of microvias 170 and vias 160 as shown in a cutaway edge view of the module 50 in FIG. 6. The microvias 170 are formed from the top side signal layer 88 and extend through the insulating layer 90 to contact the ground layer 92. After the microvias 170 are formed, the microvias 170 may be filled with a conductive material, including tin lead, or any other appropriate material. Similar microvias 170 extend through the bottom side signal layer 124. The microvias 170 in the bottom side signal layer 124 extend through the insulating layer 122 to contact the ground layer 120.

As shown in FIGS. 3A and 3B, the module 50 is arranged so the top side signal layer 88 and the bottom side signal layer 124 are approximate mirror images of each other. By having the signal layers 88 and 124 be approximate mirror images, the microvias 170 in the top side signal layer 88 correspond to the microvias 170 in the bottom side signal layer 124. Thus, for each microvia 170 providing a ground connection from the top side signal layer 88 to the first ground layer 92, another microvia provides a similar connection from the bottom side signal layer 124 to the second ground layer 120. As can be appreciated, the connections from the signal layers 88 and 124 to the ground layers 92 and 120 through the use of the microvias 170 do not require the use of escape routing 155 or trace lines 162.

An advantage of having the top side signal layer 88 and the bottom side signal layer 124 being approximate mirror images is the ability to have the drilled vias 160 extend completely through the module 50. As can be seen in FIG. 6, a via 160 may be drilled from the top side signal layer 88 and extend completely through the module 50 and eventually exit through the bottom side signal layer 124. If the drilled via 160 is positioned in the quadrant 175 on the top side signal layer 88, the approximate mirror image design of the bottom side signal layer 124 ensures the drilled via 160 exits the bottom side signal layer 124 through a similar quadrant. Therefore, the drilled via 160 does not interfere with the surface mount pads 150, escape routing 155, or trace lines 162 on the bottom side signal layer 124. Further, any design layout of all the surface mount pads 150, escape routing 155, and trace lines 162 on the top side signal layer 88 can be used without significant redesign on the bottom side signal layer 124. This permits an increased number of processors and memory circuits to be installed on the module 50 without a significant increase in the overall design cost and complexity. The drilled vias 160 may also connect the top side or bottom side signal layers 88 and 124 to any other layer of the module 50 using conventional construction techniques.

FIG. 7 illustrates a portion of the module 50 having a semiconductor device 200 mounted on one of the footprints. The footprints, which in one embodiment may be a ball grid array, permit electrical interconnection of the contacts 205 of the semiconductor device 200 to the module 50. Each contact 205 connects a pin of the semiconductor device 200 to a surface mount pad 150 within a processor footprint. The use of ball grid arrays, surface mount pads 150, and footprints are well known in the art and will not be described in detail herein.

FIG. 7 also illustrates the use of microvias 170 to connect several of the contacts 205 to the ground plane layer 92. The microvias 170 are generally of a size slightly smaller than the surface mount pads 150. Therefore, a microvia 170 can be completely contained within a surface mount pad 150 without protruding to other portions of the module 50. The use of microvias 170 permits electrical connection between the surface mount pads 150 through the first top side signal layer 88 and the first dielectric layer 90 to the ground layer 92. Thus, the electrical connection is made directly from the contacts 205 of the semiconductor device 200 to the ground layer 92. This connection is made without the use of any escape routing 155 or any trace lines 162. The microvias 170 may also be filled with a conductive element, such as tin lead. The use of a conductive element in the microvias 170 improves electrical conduction. Due to the symmetrical layout of the module 50, similar microvias 170 may connect surface mount pads 150 of semiconductor devices 200 to the ground layer 120 from the bottom side signal layer 124.

FIG. 8 shows an exploded view of the top three layers of the module 50. The top side signal layer 88, the ground layer 92, and the first signal layer 94 are shown without the accompanying insulation layers or remaining layers of the module 50. As can be appreciated, the bottom three layers of the module 50 are similar to the top three layers as shown in FIG. 8. The top side signal layer 88 contains memory footprints 60, 62 and 64 and processor footprints 52, 55 and 57 as described above. As can now be appreciated, semiconductor processor devices (e.g., digital signal processors) may be mounted on the processor footprints 52, 55, and 57, while semiconductor memory devices (e.g., SRAMs) may be mounted on the memory footprints 60, 62, and 64. Other types of semiconductor devices other than processors and memory can be used on a module 50; however, the use of processor and memory circuits will be described to illustrate one embodiment of the invention.

The ground layer 92 contains regions 225, 230, and 240 which correspond to the location of the processor footprints 52, 55, and 57 on the top side signal layer 88. The ground layer 92 also contains regions 220, 235, and 245 which correspond to the locations of the memory footprints 60, 62, and 64 on the top side signal layer 88. As can be seen on the ground layer 92, microvias 170 within the regions 225, 230, 240 provide for ground connections from the processor footprints 52, 55, 57 to the ground plane 92. The microvias 170 are also located in the regions 220, 235, 245 to provide connections from the memory footprints 60, 62, and 64 to the ground plane 92. Generally, the majority of the microvias 170 used in the module 50 connect surface mount pads 150 within the processor footprints 52, 55, and 57 and the memory footprints 60, 62, and 64 to the ground plane 92. However, the use of microvias 170 is not limited to connecting the surface mount pads 150 within a processor footprint or memory footprint to the ground plane 92. The microvias 170 may be used anywhere on the module 50 to electrically connect a point on the top side signal layer 88 to the ground layer 92.

Trace routing lines 162 on the first signal layer 94 are also shown in FIG. 8. Because the microvias 170 connect the top side signal layer 88 to the ground layer 92 and the microvias do not extend to the first signal layer 94, the first signal layer 94 is free from any trace lines 162 or vias 160 which would otherwise be necessary to connect the top side signal layer 88 to the ground layer 92. The first signal layer 94 may include trace routing lines 162 directly beneath the microvias 170 on the ground layer 92. Because the microvias 170 do not extend to the first signal layer 94, the amount of surface area available for trace routing lines 162 is significantly increased. The space previously occupied by a via 160 is now available for trace routing lines 162. Therefore, bus lines 260, 265 may extend across substantially the entire first signal layer 94. The bus lines provide connections to a signal anywhere along the bus lines 260, 265, thus providing a more controlled bus signal for the module 50.

Further, signals travelling along the trace lines 162 on the top side signal layer 88 and signals travelling along the bus lines 260, 265 on a first signal layer are isolated by the ground layer 92. The current flow along the trace lines 162 and the bus lines 260 and 265 causes noise. The ground layer 92 isolates any noise from the trace lines 162 on the top side signal layer 88 from the trace lines 162 or the bus lines 260, 265 on the first signal layer 96. The second ground layer 120 provides similar isolation between the bottom side signal layer 124 and the signal layer 116.

Testing of multiple processors on the module 50 is also problematic. To maximize flexibility, it is desirable to have a single printed circuit board capable of hosting multiple processors. However, not every application requires the processor module to include the maximum number of processors the module is capable of hosting. To reduce cost, it is desirable to provide each module with only the fewest number of processors necessary, while maintaining the ability to test each processor on the module. One method for testing the processors is the boundary scan IEEE Standard 1149.1 introduced by the Joint Test Action Group (JTAG). JTAG testing, however, is a serial test method in which the test vectors propagate through the module in a sequential fashion. JTAG does not work if a integrated circuit is missing from the serial test path. Therefore, if a module was not fully populated with processors, JTAG testing was not possible.

FIG. 9 illustrates a test path 290 in an embodiment of the invention wherein the top side signal layer contains three processor footprints 52, 55, and 57 and the bottom side signal layer 124 contains three processor footprints 275, 280, and 285. The number of processor footprints on either the top side signal layer 88 or the bottom side signal layer 124 may be adjusted by design requirements.

Processors installed on the module 50 may be tested using the test path 290 as shown in FIG. 9. The test path 290 contains a test input 295 and a test output 297. The test path 290 extends from the test input 295, to a first processor test input 300. The first processor test input 300 connects to a semiconductor device 200, in one embodiment a processor, installed on the processor footprint 55 on the top side signal layer 88. The first processor test input 300 connects to the test circuitry input in the processor 200. A first processor test output 305 connects the test circuitry of the semiconductor device 200 to the test path 290 and to a second processor test input 310 on the processor footprint 52. Again, the second processor test input 310 permits electrical connection to the test input circuitry of the semiconductor device 200 mounted on the processor footprint 52. A second processor test output 315 electrically interconnects the test output circuitry of the semiconductor device 200 installed on the processor footprint 52 to the third processor test input 320. The third processor test input 320 permits electrical connection to the test circuitry of a semiconductor device 200 installed on processor footprint 57. A third processor test output 325 connects the test circuitry output of the semiconductor device 200 installed on the processor footprint 57 to the fourth processor test input 330. The fourth processor test input 330 permits electrical connection to the test circuitry of a semiconductor device 200 installed on a processor footprint 275 on the bottom side signal layer 124. A fourth processor test output 335 electrically interconnects the test circuity output of the semiconductor device 200 on the processor footprint 275 on the bottom side signal layer 124 to a fifth processor test input 340.

In the embodiment of the invention illustrated in FIG. 9, no semiconductor device 200 is installed on either processor footprint 280 or processor footprint 285 on the bottom side signal layer 124. To ensure a test signal continues along the test path 290 even when a semiconductor device is not installed on either of the processor footprints 280 or 285, test bypass elements 342 and 352 are included in the test path 290. A pair of mounting pads (not shown) are located proximate to each processor footprint to provide electrical interconnections for the test bypass elements. The test bypass element 342 connects the fifth processor test input 340 to a fifth processor test output 345 and the test bypass element 352 connects a sixth processor test input 350 to a sixth processor test output 355. In one embodiment, the test bypass elements 342 and 352 are zero ohm resistors. After the sixth processor test output 355, the test path 290 terminates in the test output 297.

In operation, a test vector, such as a JTAG test signal, is applied to the test input 295. The test vector travels along the test path 290 to the test circuitry of the semiconductor device 200 on a processor footprint 55. The test vector continues through the semiconductor device 200 on the processor footprint 52 and through the semiconductor device 200 on the processor footprint 57. The test vector also travels to the test circuitry of the processor 200 on processor footprint 275. Once the test vector exits the fourth processor test output 335, the test vector travels through the processor footprints 280 and 285 without encountering any further test circuitry or indicating test errors by passing through the test bypass elements 342 and 352. The test vector exits the module through the test output 297. The output test vector may be used to determine if the test circuitry of any of the semiconductor devices 200 provides an error. If an error is detected, the entire module 50 can be removed and a new module 50 inserted to repair the printed circuit board. An entire new motherboard is not necessary for repairs.

Specific pinouts of the JTAG test connections according to one embodiment of the invention are shown in FIG. 10. The JTAG test connections are connected to selected pins of the connector pinout 66 of the module 50. This permits access of the test circuitry through software on the motherboard without having to manually connect to the test circuitry of the semiconductor devices 200 on the module 50. In one embodiment, the test circuitry is connected through connector pins 71–76. The test input 295 is located on connector pin 75. The test output 296 is located on connector pin 76. Other test pinouts include the DE connection on connector pin 71, the test reset on connector pin 72, the TMS on connector pin 73, and the test clock on connector pin 74.

The use of trace routing 162 (FIG. 5) permits connections from the connector pinout 66 to the test input and output connectors on the semiconductor devices 200. By providing the test inputs on the connector pinouts 66, a motherboard designer can maintain a consistent design of test circuitry without having to consider the specific connector pinouts of the semiconductor devices 200. A change in semiconductor devices 200 can be compensated for by modifying the trace routing to the connector pinouts 66 on the module 50.

Figure 11A:
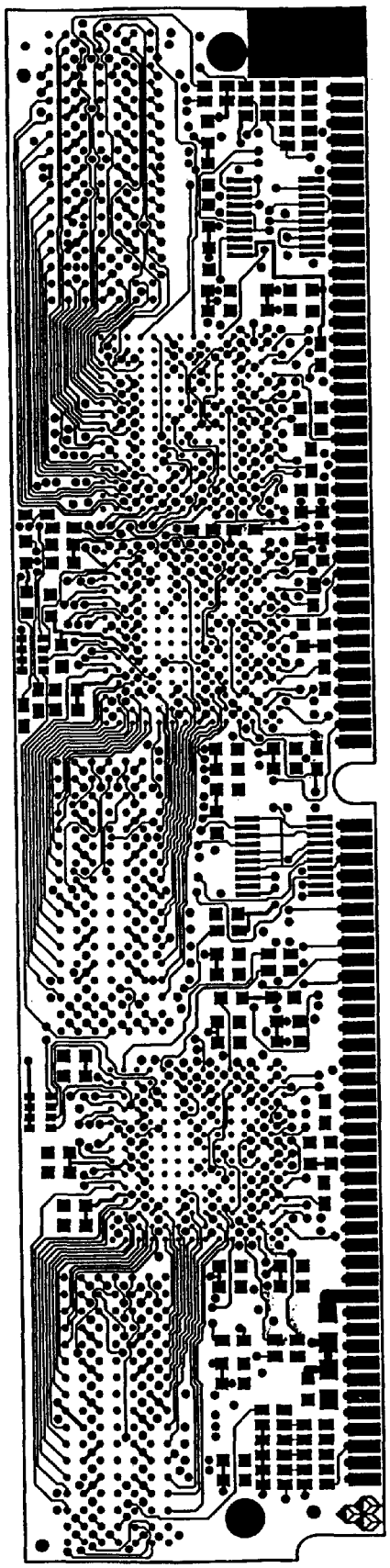
FIGS. 11A–11J are plan views showing each layer of an exemplary printed circuit board according to one embodiment of the present invention.
Figure 11B:
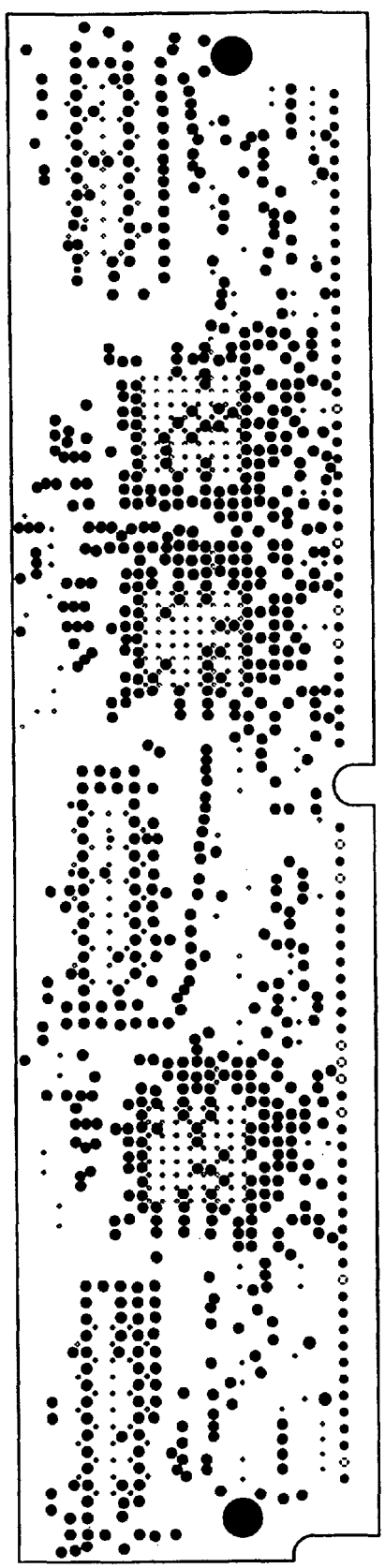
Figure 11C:
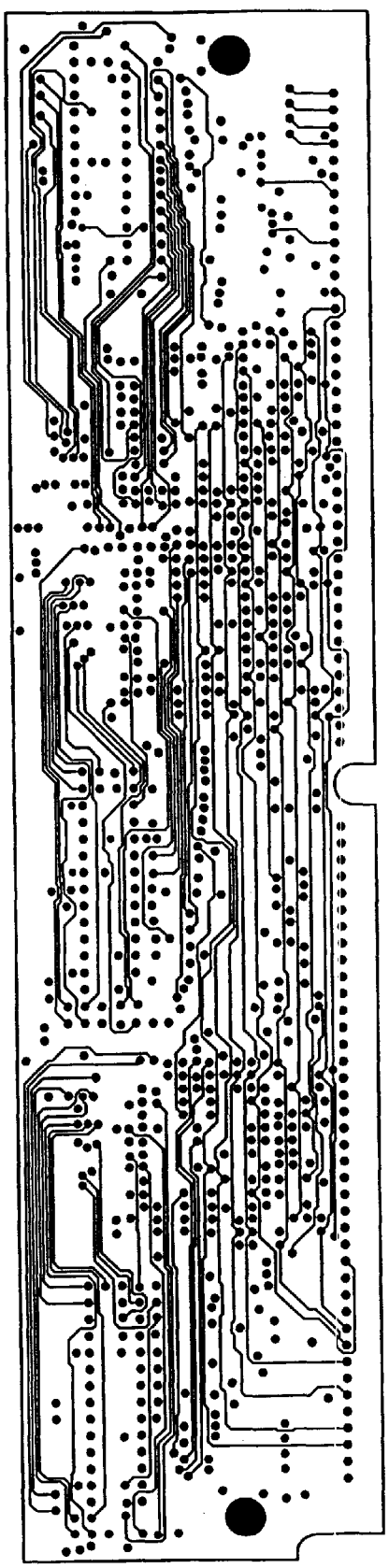
Figure 11D:
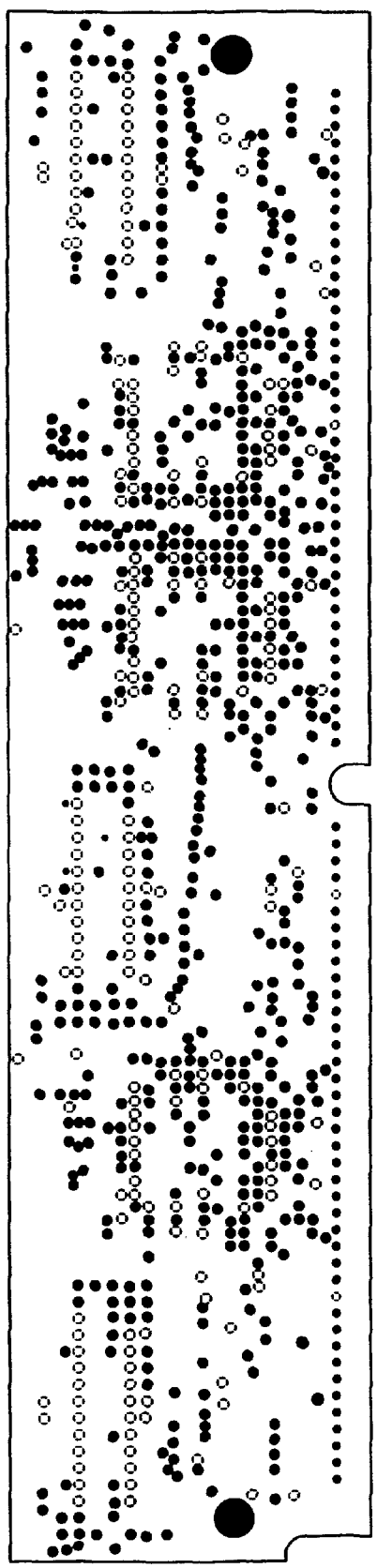
Figure 11E:
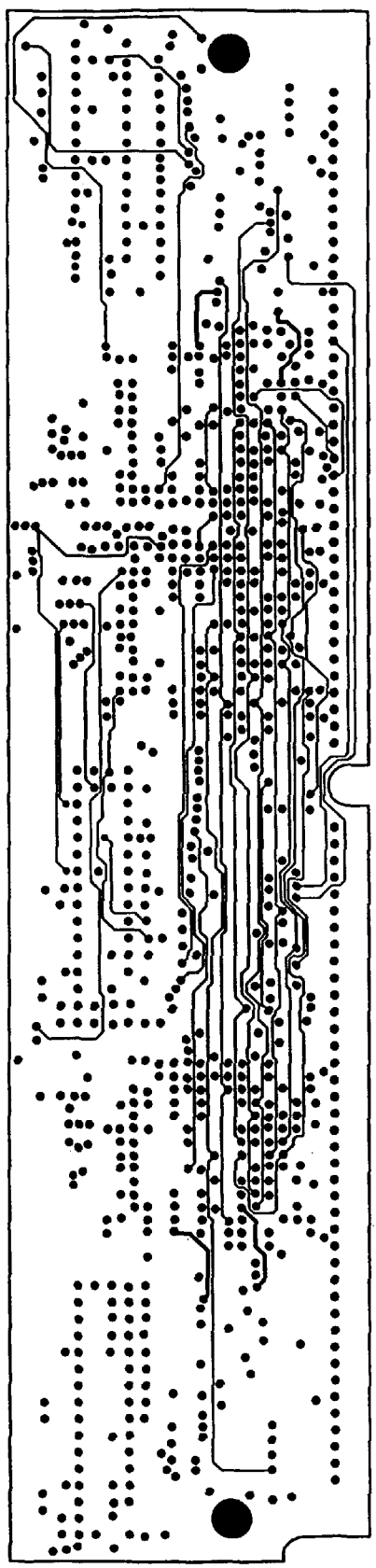
Figure 11F:
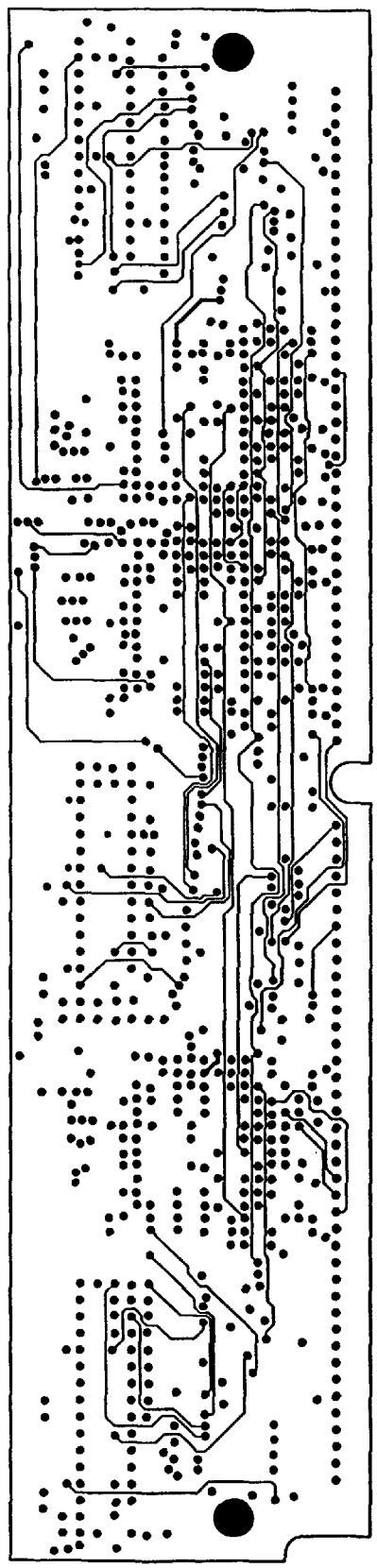
Figure 11G:
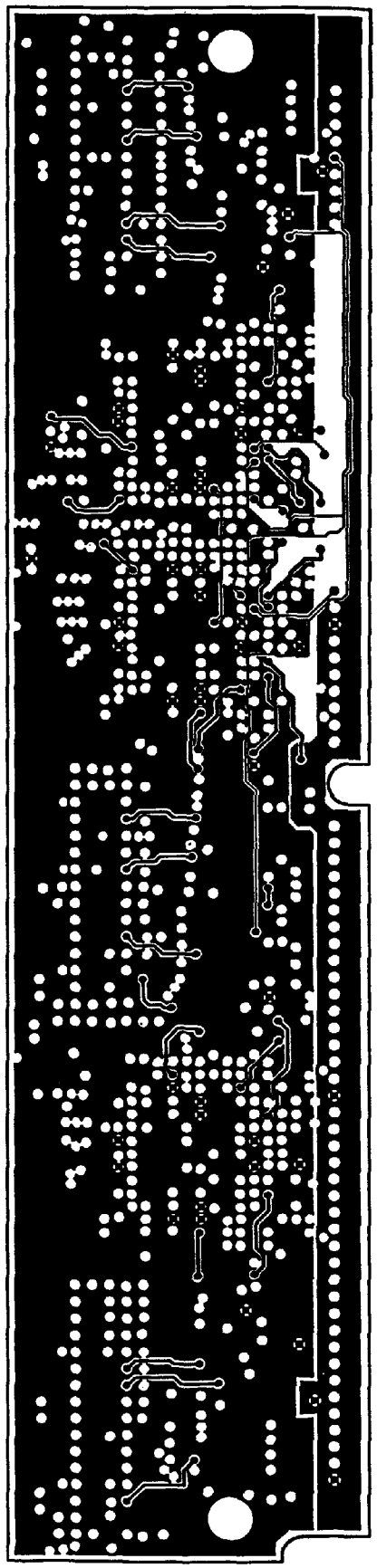
Figure 11H:
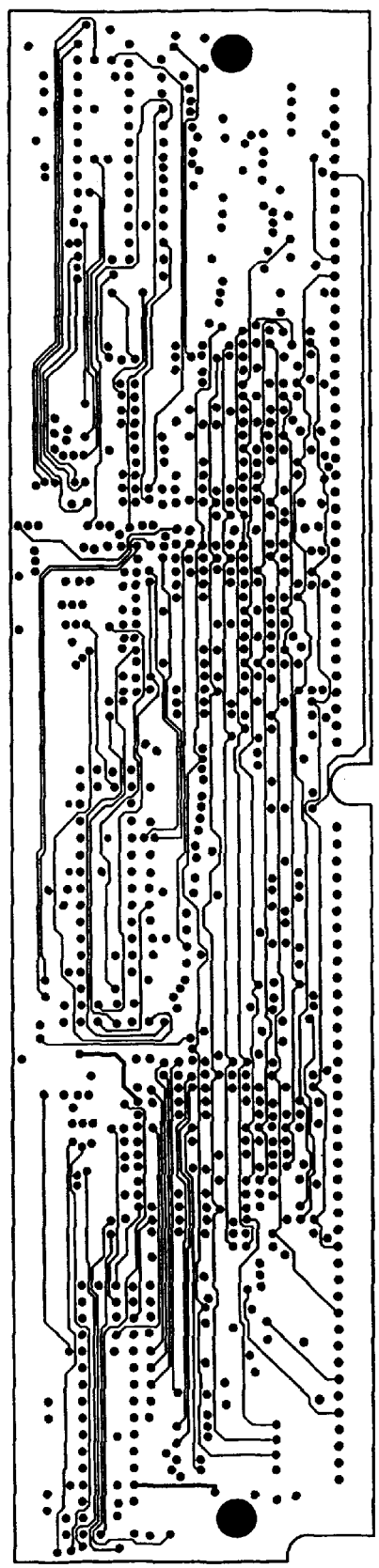
Figure 11I:
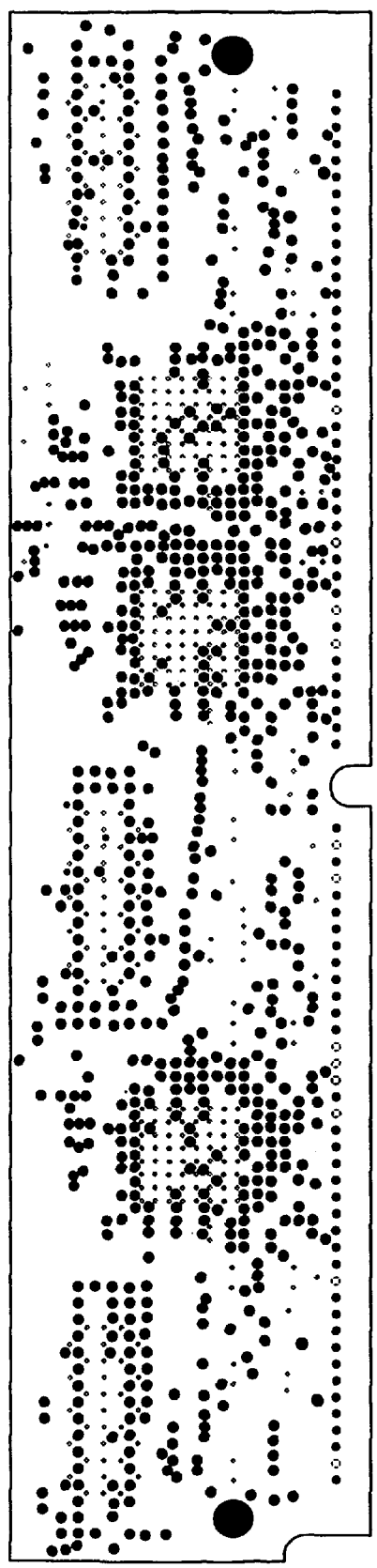
Figure 11J:
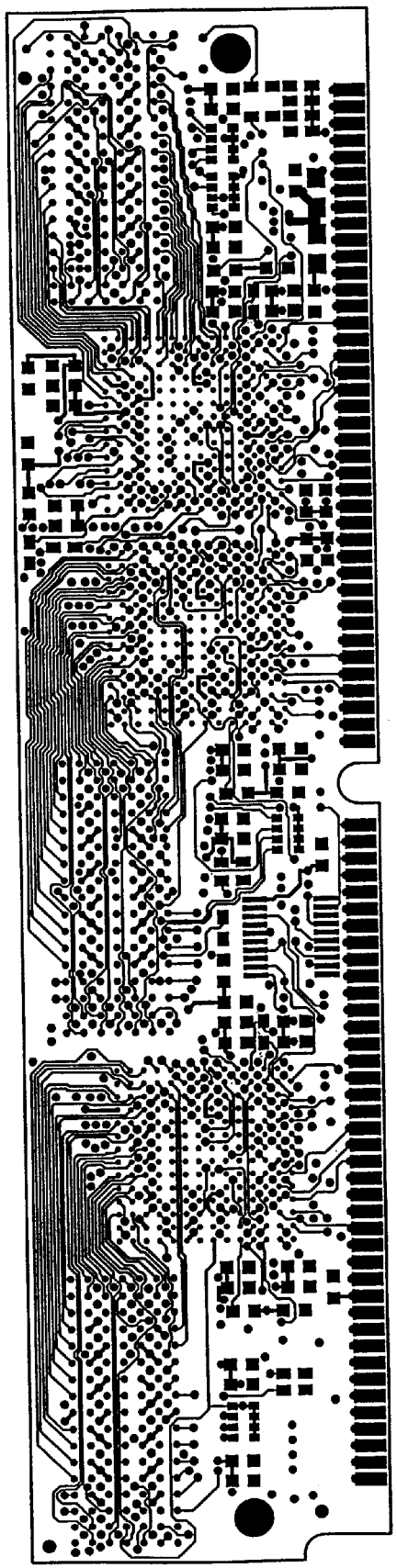

FIGS. 11A–11J are plan views of the ten layers of an exemplary printed circuit board according to one preferred embodiment of the invention. It should be noted that in FIGS. 11A, 11C, 11E, 11F, 11G, 11H, and 11J the conductive portions (e.g., copper) are illustrated with dark lines and fills. In FIGS. 11B, 11D, and 11I the dark areas illustrate the non-conductive portions and the light areas represent the conductive portions (e.g., the ground and power planes).

Numerous variations and modifications of the invention are possible. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. For example, although the embodiment shown and described has a symmetrical design, the present invention may be used in non-symmetrical printed circuit boards. All changes which come within the meaning and range of equivalency of the claims are to be embraced within their scope.

What is claimed is:

1. A method of testing integrated circuits mounted on a printed circuit board comprising the steps of:
    linking a plurality of footprints to create a test path having an input and an output, wherein each of said plurality of footprints has a test input and a test output;
    inserting a test bypass element between said test input and said test output of each of said plurality of footprints not populated by an integrated circuit; and
    applying a test vector to the test input pin of said test path.

2. The method of claim 1, further comprising the step of connecting said input of said test path to a pin of an edge connector of said printed circuit board.

3. The method of claim 1, further comprising the step of connecting said output of said test path to a pin of an edge connector of said printed circuit board.

4. The method of claim 1, wherein the testing of the integrated circuits is performed using JTAG.

5. The method of claim 1, wherein the test bypass element is a zero ohm resistor.

6. The method of claim 1, wherein the test path is a series path connecting each of the plurality of footprints.

7. The method of claim 2, wherein the printed circuit board has 72 edge connector pinouts.

8. The method of claim 2, wherein the printed circuit board has 80 edge connector pinouts.

9. The method of claim 8, wherein the input of said test path is connected to pin 75 of the edge connector.

10. The method of claim 8, wherein the output of said test path is connected to pin 76 of the edge connector.

11. A multilayer printed circuit board comprising:
    a first signal layer having a first plurality of signal lines and a second signal layer having a second plurality of signal lines, wherein a signal travels from one of the first plurality of signal lines to one of said second plurality of signal lines without encountering a substantial change in impedance; and
    a ground layer between said first signal layer and said second signal layer, said ground layer reducing crosstalk between said first and second signal layers.

12. The multilayer printed circuit board of claim 11, wherein one of said plurality of signal lines may extend substantially across said second signal layer to form a bus line.

13. The multilayer printed circuit board of claim 12, wherein said one of said plurality of signal lines is substantially straight.

14. The multilayer printed circuit board of claim 11, wherein the first and second signal layers and the ground layer are individual conductive layers of a plurality of conductive layers.

15. The multilayer printed circuit board of claim 14, wherein each of said plurality of conductive layers extending from a top of the printed circuit board has a corresponding symmetrical layer extending from a bottom of the printed circuit board.

16. The multilayer printed circuit board of claim 11, wherein an insulation layer is positioned between two of said plurality of conductive layers.

17. A printed circuit board having at least twelve footprints capable of mounting integrated circuits, said printed circuit board comprising:
    a plurality of conductive layers;
    a plurality of insulation layers, wherein each of the plurality of conductive layers is separated by one of said plurality of insulation layers, said layers having dimensions of approximately 11.43 centimeters in length and approximately 2.5 centimeters in height;
    a first plurality of surface mount pads within said footprints adapted to mount half of said at least twelve integrated circuits on a first of said plurality of conductive layers, wherein said first of said plurality of conductive layers forms a top signal layer of said printed circuit board;
    a second plurality of surface mount pads within said footprints adapted to mount half of said at least twelve integrated circuits on a second of said plurality of conductive layers, wherein said second of said plurality of conductive layers forms a bottom signal layer of said printed circuit board; and
    a plurality of microvias within each of said first and second plurality of surface mount pads, wherein each of said plurality of microvias directly electrically connects either said top signal layer to a first ground layer or said bottom signal layer to a second ground layer.

18. The printed circuit board of claim 17, further comprising a plurality of connector pinouts adapted to electrically interconnect the printed circuit board to a host board.

19. The printed circuit board of claim 18, wherein the printed circuit board has 80 connector pinouts.

20. The printed circuit board of claim 18, wherein the printed circuit board has 72 connector pinouts.

21. The printed circuit board of claim 17, wherein the first ground layer is the first conductive layer from the top signal layer.

22. The printed circuit board of claim 17, wherein the second ground layer is the first conductive layer from the bottom signal layer.

23. The printed circuit board of claim 17, wherein the second plurality of surface mount pads is an approximate mirror image of the first plurality of surface mount pads.

24. The printed circuit board of claim 23, further comprising at least one via extending through the printed circuit board.

25. The printed circuit board of claim 24, wherein said at least one via extends from a quadrant on said top signal layer to a quadrant on said bottom signal layer.

26. The printed circuit board of claim 17, wherein at least one of the integrated circuits is a digital signal processor.

27. The printed circuit board of claim 17, wherein at least one of the integrated circuits is a static random access memory circuit.

* * * * *